United States Patent
Salomon et al.

(10) Patent No.: US 7,442,091 B2
(45) Date of Patent: Oct. 28, 2008

(54) BACK-TO-BACK PCB DOUBLE-SIDED USB CONNECTOR

(75) Inventors: Tavi Salomon, Holon (IL); Yuval Alpert, Givataim (IL); Shahar Ben David, Kiryat Ono (IL)

(73) Assignee: SanDisk iL Ltd., Kfar Saba (IL)

( * ) Notice: Subject to any disclaimer, the term of this patent is extended or adjusted under 35 U.S.C. 154(b) by 0 days.

(21) Appl. No.: 11/951,386

(22) Filed: Dec. 6, 2007

(65) Prior Publication Data

US 2008/0139006 A1 Jun. 12, 2008

Related U.S. Application Data

(60) Provisional application No. 60/868,939, filed on Dec. 7, 2006.

(51) Int. Cl.
*H01R 24/00* (2006.01)
(52) U.S. Cl. .................. 439/660; 361/748; 174/250
(58) Field of Classification Search .............. 439/660, 439/65, 62; 361/748; 174/250
See application file for complete search history.

(56) References Cited

U.S. PATENT DOCUMENTS 6,469,255 B2 * 10/2002 Watanabe et al. ........... 174/254
7,094,086 B2   8/2006 Teicher
2004/0192116 A1 * 9/2004 Matsuo et al. .............. 439/660
2006/0203456 A1 * 9/2006 Sohn et al. .................. 361/748
2007/0243769 A1  10/2007 Atsmon et al.

FOREIGN PATENT DOCUMENTS

WO    2005/124932    12/2005

* cited by examiner

*Primary Examiner*—Tho D Ta
(74) *Attorney, Agent, or Firm*—Mark M. Friedman

(57) ABSTRACT

A double-sided USB connector may include a first PCB that may provide a first set of electrical contacts on its first side and solder pads on its second side. The first PCB may further include a components side, solder pads, and signal traces. The double-sided USB connector may also include a second PCB that may provide a second set of electrical contacts on its first side and terminals on its second side. Contacts selected from the second set of contacts may be connected to selected terminals, for example through via paths in the second PCB. Contacts from the first and second sets of contacts may selectively be connected to components on the first PCB using signal traces rather than wires. The first PCB may be joined to the second PCB by using the terminals, and the two PCBs may be packaged using a common molded body.

6 Claims, 3 Drawing Sheets

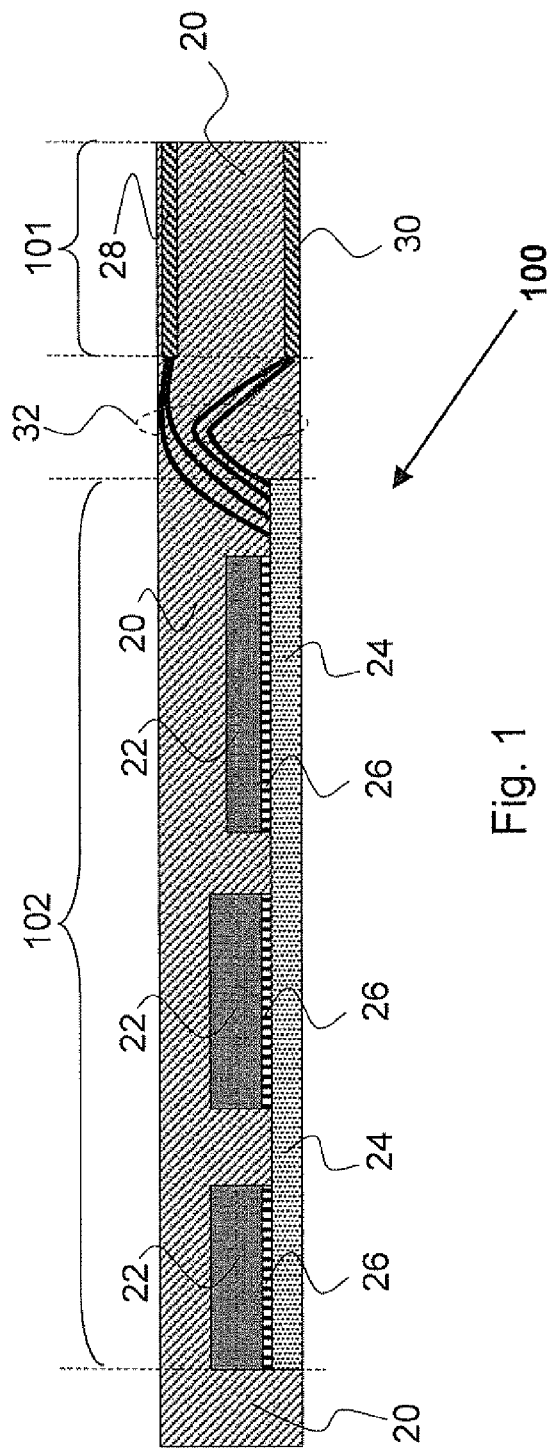
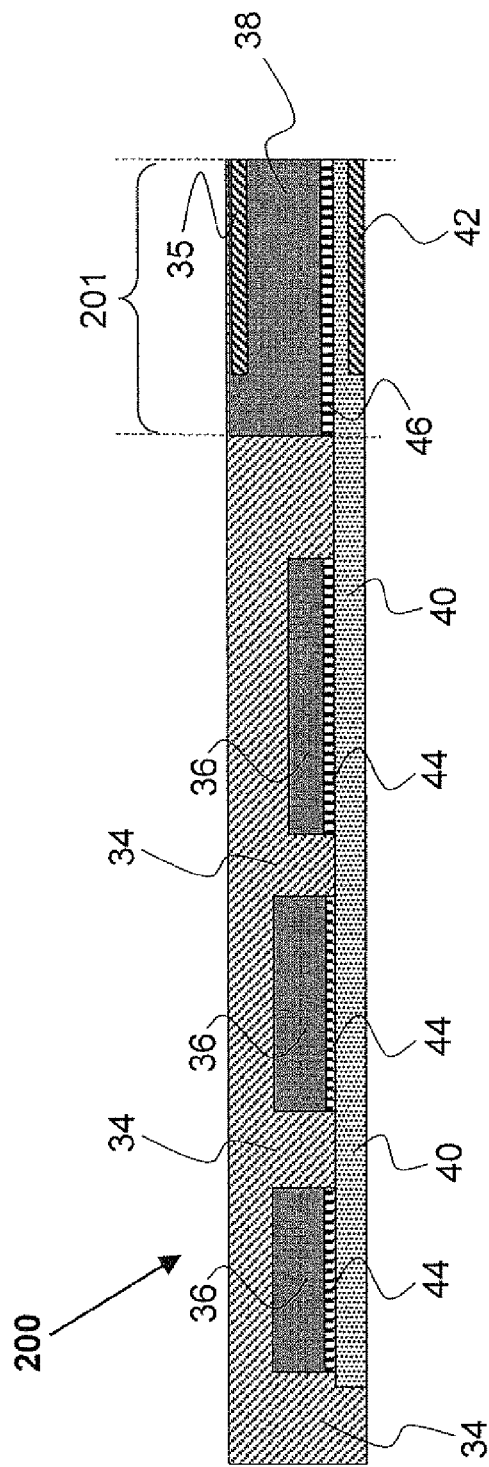

BACK-TO-BACK PCB DOUBLE-SIDED USB CONNECTOR

REFERENCE TO EARLIER-FILED APPLICATIONS

This application claims priority under 35 U.S.C. § 119(e) to U.S. Provisional Application No. 60/868,939, filed Dec. 7, 2006, which is hereby incorporated by reference in its entirety.

BACKGROUND

A portable electronic card, chip card, or integrated circuit(s) card (ICC), usually refers to various pocket-sized electronic cards with embedded integrated circuit(s), which can receive, process and output data. A pocket-sized electronic card typically has a molded body that usually is made of plastic. Such cards include connectors, such as a Universal Serial Bus (USB) connector, by which they interact with external devices or hosts. The use of electronic cards with USB connector continues to become more prevalent.

One type of USB connectors includes a metal shell to protect the connector's electrical contacts and to facilitate a better mechanical grip by USB ports. In some cases, though, a USB connector without a metal shell is preferred, for example because USB connectors without a metal shell are usually smaller and less expensive to manufacture relative to shelled connectors. A type of USB connector which is gaining popularity is the double-sided USB connector.

A double-sided USB connector consists of two, substantially opposing, contact areas, one of which provides a USB interface for data communications, and the other provides, or is used as, an electrical power contact through which a USB host can power the embedded electronic components of the USB card. In another type of electronic cards the "other" contact area is used to communicate another type of signal, for example audio signal. The two substantially opposing contact areas of the double-sided connector typically are provided on the external surface of the USB card. Pocket-sized cards typically include double-sided USB connectors with exposed contact areas (i.e., no protective shell is used to protect the electrical contacts) because such cards, which typically have a thickness less than 2 millimeters (mm), cannot accommodate a shelled USB connector. "Wallet Flash", a pocket-sized card from Walletex Microelectronics Ltd, includes such a connector.

Traditionally, pocket-sized cards include, as FIG. 1 illustrates, a double-sided USB connector interfaced with a Printed Circuit Board (PCB) assembly that includes the card's embedded electronic components, which are usually mounted on the PCB by using surface-mount technology (SMT). "SMT" references a method for constructing electronic circuits in which the components are mounted on the surface of a PCB by soldering the components' terminals to corresponding solder pads on the PCB. "Solder pad" references flat, usually tin-lead, silver or gold plated copper pad without a hole. SMT technology has largely superseded the through-hole technology, a technology that involves fitting components with electric wire leads into holes in the circuit board. In surface-mount construction, the components are soldered to pads or lands on the outer surfaces of the PCB, for which reason surface mounting lends itself well to a high degree of automation, reducing labor cost and greatly increasing production rates.

FIG. 1 schematically illustrates a pocket-sized card 100 in accordance with the prior art. Pocket-sized card 100 includes two, traditionally separated, parts. The first part, generally designated as 101, includes a double-sided USB connector, the double-sided USB connector including a first contact area 28 of the USB connector and a second contact area 30. Contact area 30 is consisted of a first set of electrical contacts and contact area 28 is consisted of a second set of electrical contacts. The electrical contacts may be made from, or include, a flat, usually tin-lead, silver or gold plated copper.

The second part of the pocket-sized card 100, generally designated as 102, includes the PCB 24 section with electronic components 22 mounted thereon. Interconnecting (or interfacing) the double-sided USB connector and (with) PCB 24 traditionally involves soldering electric wires 32 both to the USB's contact areas 28 and 30 and to corresponding solder pads on PCB 24. As part of the assembly of PCB 24, terminals of electronic components 22 (the terminals generally designated as 26), are soldered to corresponding solder pads on PCB 24. For the sake of simplicity, only three electrical components are shown mounted on PCB 24. However, a typical card may have a different number of electronic components, and usually more than three.

Traditionally, PCB 24 is first assembled and then connected to the USB's contact areas 28 and 30 using electric wires 32. However, using wires such as wires 32 requires that a wire inventory be managed, and manual soldering of wires is costly and time-consuming. In addition, manual wiring is prone to errors, for which reason a wiring inspection phase has to be performed prior to the packaging of the card's components in a molded body, such as molded body 20 of card 100.

It would be beneficial to have a pocket-sized card which does not require hard-wiring the PCB to the USB connector and which would facilitate the automation of its assembling process that may include, for example, a wave soldering technique. "Wave soldering" references a soldering process by which electronic components are soldered to a PCB to form an electronic assembly. As part of that process, electrical components are placed on the PCB and the PCB is passed across a wave of solder such that the solder wets to the exposed solder pads of the PCB. U.S. Patent application 200710243769 ('769, for short), to Atsmon et al., discloses a double-sided USB connector with a main PCB, which carries the electrical components, and a connector PCB. However, according to '769 the connector PCB carries the two contact strips of the connector and whether the connector PCB can be soldered on top of the main PCB like the rest of its electrical components (i.e., in an automated soldering process) is questionable. Therefore, it would also be desirable to have a method that would enable assembling portable and pocket-sized electronic cards with a better degree of automation. It would also be desirable to provide a USB card whose design reduces the number of costly assembly operations.

SUMMARY

The following embodiments and aspects thereof are described and illustrated in conjunction with systems, tools, and methods, which are meant to be exemplary and illustrative but not limiting in scope.

As part of the present disclosure a double-sided universal serial bus (USB) connector, which may be a reversible connector, is disclosed, the double-sided USB connector may include a first PCB, which may have, support, include, or provide a first set of electrical contacts on its first side and solder pads on its second side substantially opposite the first set of electrical contacts. The first PCB may further include components on its components side, solder pads, and signal traces to create an electric circuitry.

The double-sided USB connector may also include a second PCB that may have, support, include, or provide, a second set of electrical contacts on its first side and terminals on its second side (i.e., a terminals side) which may be substantially opposite the second set of electrical contacts. Contacts selected from the second set of contacts may be connected to selected terminals, for example through via paths in the second PCB. The first PCB may be joined to the second PCB by using the terminals.

As part of the present disclosure a portable electronic card that includes the double-sided USB connector is also disclosed. The double-sided USB connector may include a first set of electrical contacts that form the USB connector's first contact area, and a second set of electrical contacts that form the USB connector's second contact area that is substantially opposite the first set of electrical contacts.

The portable electronic card may further include a first PCB having a components side, on which one or more components are mounted, and a first contact area formed by the first set of electrical contacts. The portable electronic card may further include a second PCB having a second contact area that is formed by the second set of electrical contacts, and a terminals side on which terminals are provided. Contacts of the second set of electrical contacts may be selectively connected to terminals on the terminals side, and the first PCB may be joined to the second circuit board using the terminals on the terminals side of the second PCB.

Contacts selected from the first set of electrical contacts or from the second set of electrical contacts may be connected to selected components on the components side of the first PCB by using signal traces rather than using wires. Connecting the selected contacts to the selected components may include connecting these contacts to selected terminals in the bottom side (i.e., terminals side) of the second PCB and soldering the selected terminals to solder pads on the first PCB. The first PCB and the second PCB may be packaged in a common molded body. The portable electronic card may be a smart card or a portable storage card.

As part of the present disclosure a method of assembling a portable card having a double-sided USB connector is disclosed. The portable card assembling method may include a) providing a first PCB with solder pads and signal traces, and with components mounted on a top side of the first PCB; b) providing a first set of electrical contacts to a bottom side of the first PCB to thereby form a first contact area of the USB connector; c) providing a second PCB, the second PCB having terminals on a bottom side of the second PCB; d) providing to a top side of the second PCB a second set of electrical contacts to thereby form a second contact area of the reversible USB connector; and e) connecting contacts selected from said first or second set of contacts to selected components using the signal traces rather than using electrical wires.

In addition to the exemplary aspects and embodiments described above, further aspects and embodiments will become apparent by reference to the figures and by study of the following detailed description.

BRIEF DESCRIPTION OF THE DRAWINGS

Exemplary embodiments are illustrated in referenced figures. It is intended that the embodiments disclosed herein are illustrative rather than restrictive. The disclosure, however, may better be understood with reference to the following detailed description when read with the accompanying figures, in which:

FIG. 1 schematically illustrates an exemplary pocket-sized electronic card according to related art;

FIG. 2 schematically illustrates an exemplary pocket-sized electronic card in accordance with the present disclosure;

Figure 3:
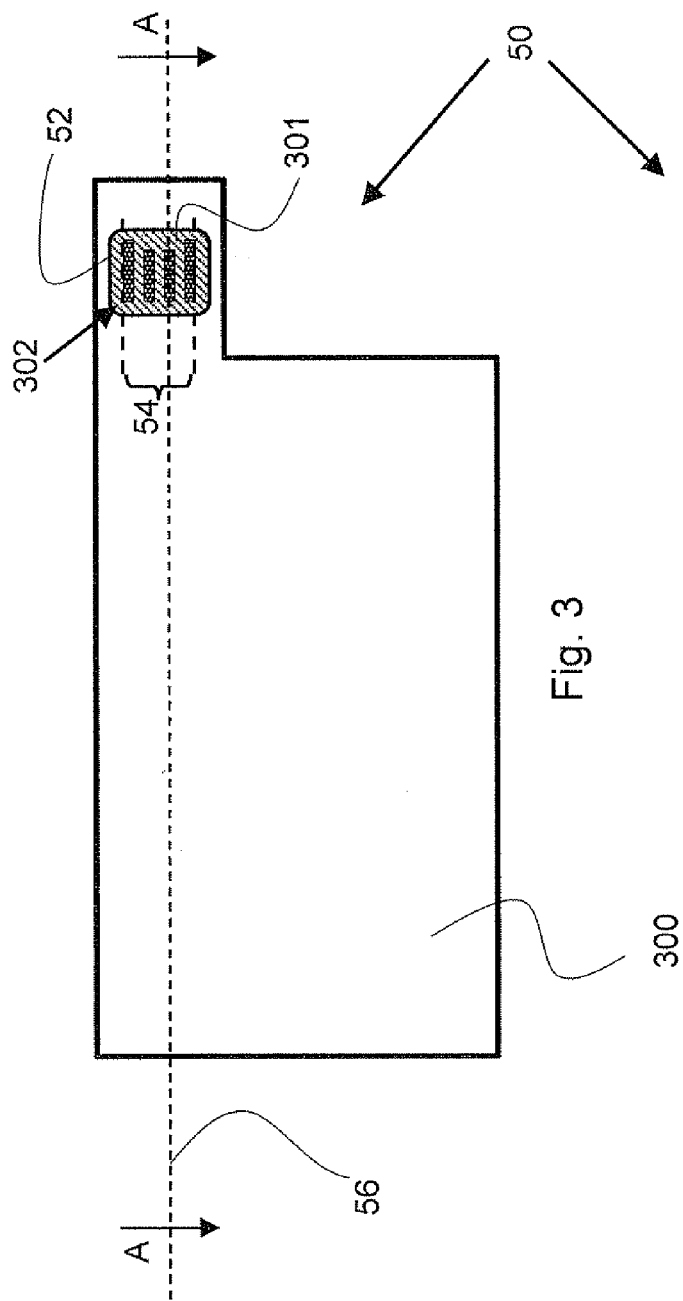
FIG. 3 schematically illustrates the upper side of the electronic card of FIG. 2.

It will be appreciated that for simplicity and clarity of illustration, elements shown in the figures are not necessarily drawn to scale. Further, where considered appropriate, reference numerals may be repeated among the figures to indicate like, corresponding or analogous elements.

DETAILED DESCRIPTION

The claims below will be better understood by referring to the present detailed description of embodiments of the invention. This description is not intended to limit the scope of claims but instead to provide examples of the invention.

In accordance with one embodiment, a novel double-sided USB connector for a pocket-sized electronic card is provided, which includes a first PCB (interchangeably referred to herein as a "main PCB") and a second PCB (interchangeably referred to herein as a "via PCB") mounted on the main PCB as an additional or supplemental component. A novel portable storage card is also provided, which includes the novel double-sided USB connector. The double-sided USB connector may be reversible.

By using a combination of a main PCB and a via PCB in the way disclosed herein, interconnection electric wires similar to wires 32 of FIG. 1 are avoided, and signal traces can beneficially be used instead. In electronics, "signal trace" of (i.e., on, and sometimes within) a PCB is the equivalent of an electric wire for conducting electrical signals. Each signal trace typically is consisted of a flat, narrow part of the copper foil that remains after etching, a process that results in the removal of unused copper on the PCB. Signal traces are designed as part of the general layout design of the PCB. Depending on the general layout design of a PCB, signal traces can include one or more via paths.

The main PCB of the present disclosure can be similar to PCB 24 of FIG. 1, with the exception that the main PCB also accommodates for a first set of electrical contacts of the novel connector on one of its sides and a via PCB on its other side, which is the side of the main PCB referred to herein as the "components side" of the main PCB. Due to the relatively small thickness of pocket-sized electronic cards, the main PCB can carry components only on one side, though this approach may change in the future.

The via PCB holds a second set of electrical contacts of the novel connector on one of its sides, and it may provide, or may include, via paths (hence referring to it as a "via PCB") through which electrical contacts selected from the second set of electrical contacts can be connected to the main PCB using soldering pads. In PCB design, "via path", or more commonly "via", references a pad with a plated hole that internally connects copper tracks from one layer of the PCB to other layer(s), or one side of the PCB to the other. The holes (i.e., via paths) are either electroplated or small rivets may be inserted. As said above, a signal trace in a card may include one or more via paths. The main PCB and the via PCB may be packaged in a common molded body to render mechanical endurance to the electronic card.

FIG. 2 schematically illustrates a portable electronic card, generally shown at 200, in accordance with one embodiment. Portable card 200 includes a double-sided USB connector, generally designated as 201. Double-sided connector 201 may be a reversible connector, a USB connector, a reversible USB connector, or another type of connector.

Double-sided connector 201 may include a first printed circuit board (PCB) 40 that may have, support, or provide, a first set of electrical contacts such as electrical contacts 42 on its first side (the bottom side of PCB 40), and solder pads (not shown in FIG. 2) on its second side (i.e., the top side, or components side, of PCB 40). The solder pads may reside substantially opposite the first set of electrical contacts 42. "Substantially opposite" refers to full, partial, or even no, overlapping between electrical contacts of the first set of electrical contacts and the solder pads. For the sake of illustration, three exemplary components are shown mounted on PCB 40 using terminals 44.

Double-sided connector 201 may also include a second PCB 38 that may have, support, or provide, a second set of electrical contacts 35 on its first side (i.e., its top side) and terminals, generally shown at 46, on its second side (i.e., a bottom side, or terminals side, of PCB 38). The second set of electrical contacts 35 may be substantially opposite the terminals 46. "Substantially opposite" may include full overlapping, partial overlapping, or even no overlapping, between electrical contacts of the second set of electrical contacts and terminal 46. As shown in FIG. 2, second PCB 38 generally resides in-between, or it is "sandwiched" between, the first set of electrical contacts 42 and the second set of electrical contacts 35 of double-sided connector 201. The first set of electrical contacts 42 and the second set of electrical contacts 35 may substantially be parallel and they may oppose one another, though this is not mandatory. Terminals 46 of second PCB 38 are adjacent the solder pads of PCB 40.

Contacts from the second set of electrical contacts 35 may selectively be connected to terminals 46, preferably through vias in the second PCB 38. Second PCB 38 and its terminals 46 may be designed as an integral part of the artwork of first PCB 40. This way, second PCB 38 can be mounted on first PCB 40 as an additional or supplemental component, for example by soldering its terminals 46 to corresponding solder pads on the first PCB 40.

Contacts selected from the first set or second set of electrical contacts (42 and 35, respectively) may be connected to selected components on the components side of the first PCB 40 using signal traces rather than using electric wires. By "first set or second set" is meant from the first set of electrical contacts 42, or from the second set of electrical contacts 35, or from both. In an embodiment of the present disclosure the portable electronic card is a portable storage card that may include the double-sided connector disclosed herein. The first set or second set of electrical contacts (42 and 35, respectively) may be recessed relative to the surface of the portable storage card.

Each of electrical contacts 42 and 35 may be made from, or include, a flat, usually tin-lead, silver or gold plated copper. The first set of electrical contacts 42 can be designed as part of the artwork of first PCB 40. The second set of electrical contacts 35 can be designed as part of the artwork of second PCB 38.

A plurality of mechanical redundant terminals on the second PCB 38 may be soldered to redundant solder pads on the first PCB 40. The plurality of mechanical redundant terminals may be part of, or selected from, terminal 46, or they may be additional terminals in the terminals side of second PCB 38. In other words, the terminals side of second PCB 38 may include as many electrical terminals as required for the operation of portable electronic card 200, and, optionally, one or more redundant terminals. A terminal in the terminals side of second PCB 38 may be redundant only in the mechanical sense, in which case it will not be part of the electrical circuitry. On the other hand, a terminal in the terminals side of second PCB 38 which is electrically redundant is also redundant mechanically.

The first PCB 40 may be joined to the second PCB 38, for example by using terminals 46, for example by soldering terminals 46 to solder pads (not shown in FIG. 2), thereby making connector 201 "double-sided". As stated before, if both the first set of electrical contacts 42 and the second set of electrical contacts 35 have the same functionality (e.g., they are both assigned, for example, USB functionality), the double-sided connector 201 is said to be "reversible". Regarding the coupling of a reversible connector to a port, in a first coupling orientation, the first set of electrical contacts 42 mechanically touches the port contacts and in a second coupling orientation the second set of electrical contacts 35 mechanically touches the port contacts.

By using two printed circuit boards such as first PCB 40 and second PCB 38, portable electronic cards can automatically be assembled using a reflow soldering process. "Reflow soldering" references a common means to attach a surface mounted component to a circuit board. In general, "reflow" involves applying solder paste, positioning the electronic components, and reflowing the solder to melt the powder particles in the solder paste, with the surfaces being joined together, and solidifying the solder to create a strong metallurgical bond. Typically, double-sided connector 201 is several times thicker than first PCB 40. Typically, second PCB 38 is also several times thicker than first PCB 40. The methodology embodied in double-sided connector 201 can be used with, or applied to, various kinds of electronic cards.

FIG. 3 shows the top view of a typical portable electronic card, shown at 50, in accordance with one embodiment. Card 50 includes a double-sided connector (generally shown at 301), the construction of which is similar to the construction of double-sided connector 201 of FIG. 2. Double-sided connector 301 may include a first PCB (not shown in FIG. 3) similar to first PCB 40 of FIG. 2, and a second PCB 302 (partly shown in FIG. 3) similar to second PCB 302. Double-sided connector 301, which may be, for example, a reversible connector, a USB connector, or a reversible USB connector, may include a first set of electrical contacts and a second set of electrical contacts 54, which reside on the (hidden) first PCB and on the second PCB 302, respectively, of card 50. The second set of electrical contacts 54 are visible through an opening 52 in the body 300 of card 50.

Figure 4:
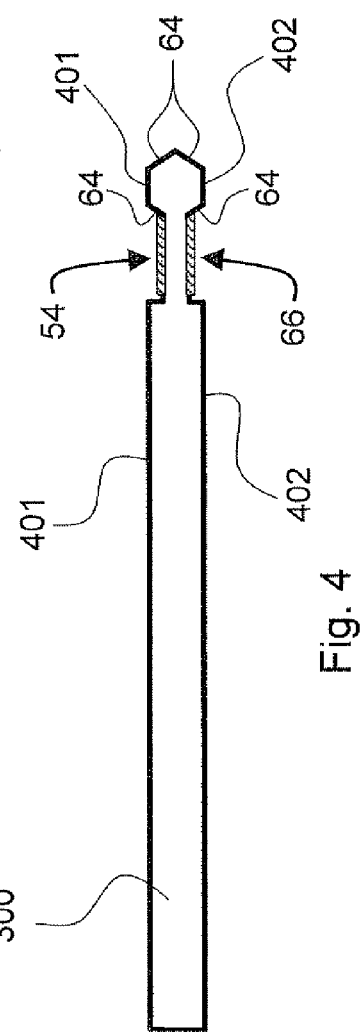
FIG. 4 shows a cross-sectional view of the electronic card of FIG. 3 along line A-A.

The external surface of second PCB 302 and the external surface of the first PCB (not shown in FIG. 3) are sufficiently recessed relative to the surface of the card's body 300, as explicitly shown in FIG. 4, to prevent the connector's contacts from being short circuited by a metallic shell of a receptacle port (not shown), for example, when double-sided connector 301 engages a USB port. A method for protecting electrical contacts from being short circuited is disclosed in U.S. Pat. No. 7,094,086.

FIG. 4 shows a cross-section A-A of the card 50 of FIG. 3 along cross-section line 56. The connector's first set of electrical contacts 54 is recessed relative to surface 401 of card 50, and second set of electrical contacts 66 is shown recessed relative to external surface 402 of card 50. Slants edges 64 in the connector 301 facilitate smooth insertion into and extraction of card 50 from a USB port, for example.

Figure 5:
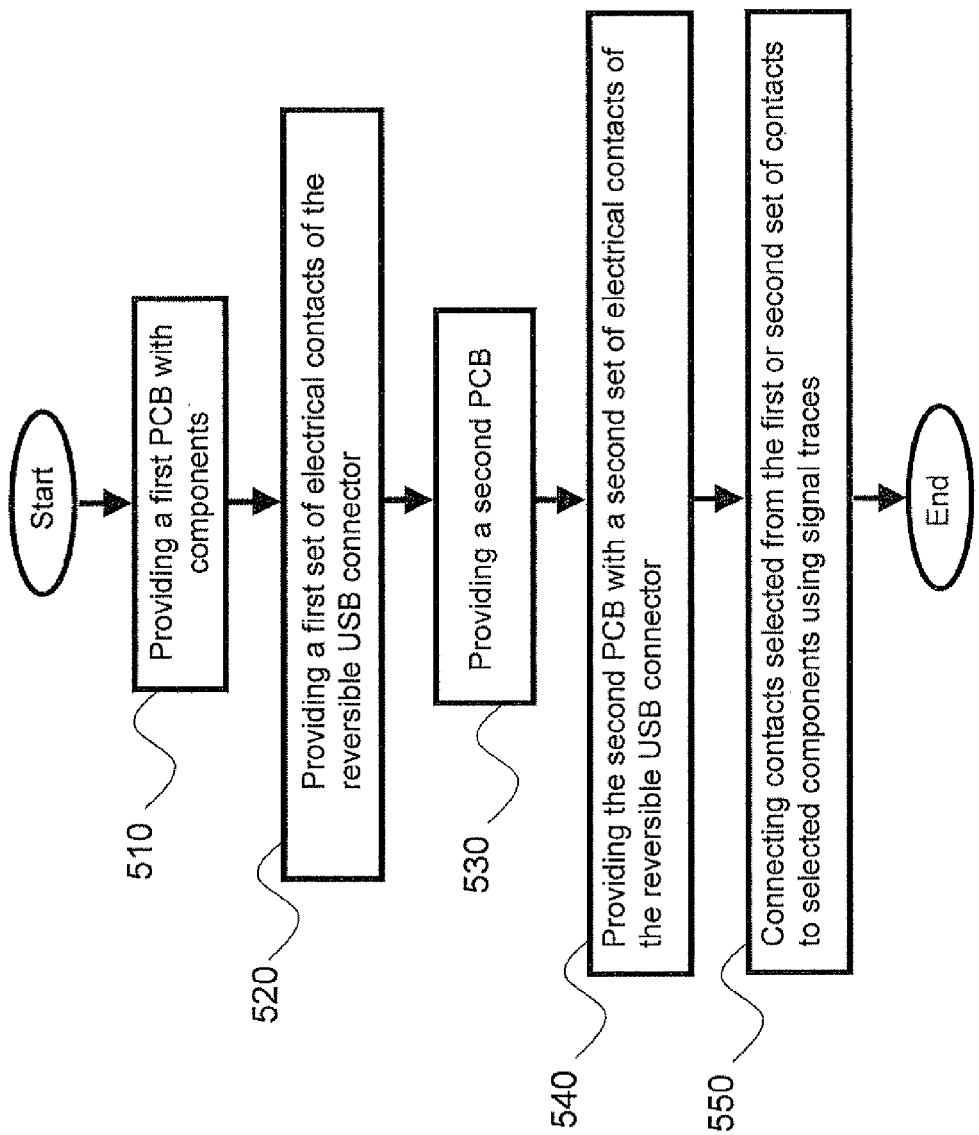
FIG. 5 is a method of assembling a portable electronic card in accordance with an embodiment of the present disclosure.

Referring to FIG. 5, it shows a flow chart of an electronic card assembling method, according to the present disclosure. FIG. 5 will be described in association with FIG. 2. At step 510 a first PCB 40 is provided with solder pads (not shown in FIG. 2) and signal traces, and with components mounted on a top side (also referred to herein as "components side") of first PCB 40. At step 520 a first set of electrical contacts 42 is provided to a bottom side of first PCB 40 to thereby form, create, or provide, a first contact area of the double-sided connector 201. At step 530 a second PCB 38 is provided with terminals on its bottom side (also referred to herein as "terminals side"). At step 540 a second set of electrical contacts 35 is provided to a top side of the second PCB 38 to thereby form, create, or provide, a second contact area of the USB connector 201. At step 550 contacts selected from the first or second set of contacts (42 or 35, respectively) are connected to selected components 36 using signal traces rather than using electrical wires Connecting selected contacts to selected components may include connecting these contacts to selected terminals in the bottom side of the second PCB 38, and soldering these terminals to selected solder pads on the first PCB 40. The method may further include packaging the first PCB 40 and the second PCB 38 in a common molded body. The portable card may be a smart card or a storage card.

Regarding FIG. 5, different or additional steps may be carried out, and steps may be joined together or be divided into sub-steps, and the order of the steps may differ. For example, the second PCB 38 may be provided before the first PCB 40. Likewise, the first contract area may be formed on the first PCB 40 before mounting the components on first PCB 40, and the second contact area may be formed on the second PCB 38 before the first contact area is formed on the first PCB 40.

Having thus described exemplary embodiments of the invention, it will be apparent to those skilled in the art that modifications of the disclosed embodiments will be within the scope of the invention. For example, the portable card's connector does not necessarily have to be a USB connector or a reversible connector. In fact, principles taught by the present disclosure can likewise be applicable, mutatis mutandis, to other types of connectors, including to one-sided connectors. Accordingly, additional alternations, modifications, and improvements of the disclosed invention, though not expressly described above, are nonetheless intended and implied to be within spirit and scope of the invention.

What we claim:

1. A method of assembling a portable electronic card having a double-sided universal serial bus connector, the method comprising:
   a) providing a first printed circuit board with solder pads and signal traces, and with components mounted on a top side of said first printed circuit board;
   b) forming a first contact area of the universal bus connector by providing a first set of electrical contacts to a bottom side of said first printed circuit board;
   c) providing a second printed circuit board, said printed circuit board having terminals on a bottom side of said second printed circuit board;
   d) forming a second contact area of the connector by providing to a top side of said second printed circuit board a second set of electrical contacts; and
   e) connecting contacts selected from said first or second set of contacts to selected components using said signal traces rather than using electrical wires.

2. The method according to claim 1, wherein connecting selected contacts to selected components includes connecting said contacts to selected terminals in the bottom side of said second printed circuit board and soldering said selected terminals to solder pads on the first printed circuit board.

3. The method according to claim 1, further comprising:
   f) packaging the first printed circuit board and the second printed circuit board in a common molded body.

4. The method according to claim 1, wherein the portable electronic card is a smart card.

5. The method according to claim 1, wherein the portable electronic card is a storage card.

6. The method according to claim 1, wherein the double-sided universal serial bus connector is reversible.

* * * * *

UNITED STATES PATENT AND TRADEMARK OFFICE
CERTIFICATE OF CORRECTION

PATENT NO. : 7,442,091 B2
APPLICATION NO. : 11/951386
DATED : October 28, 2008
INVENTOR(S) : Tavi Salomon, Yuval Alpert and Shahar Ben David It is certified that error appears in the above-identified patent and that said Letters Patent is hereby corrected as shown below:

Front page

Assignee (73) should be corrected as follows:
change
--SanDisk iL Ltd., Kfar Saba (IL)--
to
"SanDisk IL Ltd., Kfar Saba (IL)"

Signed and Sealed this

Twenty-third Day of December, 2008

JON W. DUDAS
*Director of the United States Patent and Trademark Office*